(12) United States Patent
Seo et al.

(10) Patent No.: US 11,528,833 B2
(45) Date of Patent: Dec. 13, 2022

(54) FLEXIBLE ELECTROMAGNETIC WAVE SHIELDING MATERIAL, ELECTROMAGNETIC WAVE SHIELDING-TYPE CIRCUIT MODULE COMPRISING SAME AND ELECTRONIC DEVICE FURNISHED WITH SAME

(71) Applicant: AMOGREENTECH CO., LTD., Gimpo-si (KR)

(72) Inventors: In Yong Seo, Seoul (KR); Ui Young Jeong, Incheon (KR); Jun Woo Lee, Bucheon-si (KR)

(73) Assignee: AMOGREENTECH CO., LTD., Gimpo-si (KR)

( * ) Notice: Subject to any disclaimer, the term of this patent is extended or adjusted under 35 U.S.C. 154(b) by 779 days.

(21) Appl. No.: 16/468,894

(22) PCT Filed: Dec. 12, 2017

(86) PCT No.: PCT/KR2017/014553
§ 371 (c)(1),
(2) Date: Jun. 12, 2019

(87) PCT Pub. No.: WO2018/110942
PCT Pub. Date: Jun. 21, 2018

(65) Prior Publication Data
US 2020/0084921 A1 Mar. 12, 2020

(30) Foreign Application Priority Data

Dec. 13, 2016 (KR) .......................... 10-2016-0169490
Dec. 12, 2017 (KR) .......................... 10-2017-0170429

(51) Int. Cl.
*H05K 9/00* (2006.01)
*H05K 7/20* (2006.01)

(52) U.S. Cl.
CPC ........... *H05K 9/009* (2013.01); *H05K 7/2039* (2013.01); *H05K 9/0022* (2013.01)

(58) Field of Classification Search
CPC .............................. H05K 9/009; H05K 7/2039
See application file for complete search history.

(56) References Cited

U.S. PATENT DOCUMENTS

2005/0029000 A1* 2/2005 Aisenbrey ............ H05K 9/0098
174/388
2018/0255666 A1* 9/2018 Strader ................ H05K 3/4658

FOREIGN PATENT DOCUMENTS

JP       6-152181 A      5/1994
KR    10-1079775      11/2011
(Continued)

OTHER PUBLICATIONS

Machine translation for KR 20150007827, 5 pages, translated on Apr. 8, 2022 (Year: 2015).*

(Continued)

*Primary Examiner* — Hung V Ngo
(74) *Attorney, Agent, or Firm* — Rothwell, Figg, Ernst & Manbeck, P.C.

(57) ABSTRACT

Electromagnetic wave shielding material including a conductive fiber web with multiple pores and a heat dissipation unit provided in at least some pores that is so excellent in flexibility, elasticity, and creasing/recovery that it can be changed in shape freely and brought in complete contact with a surface where the material is to be disposed even if the surface has a curved shape, uneven portions, or stepped portions, thus exhibiting excellent electromagnetic wave shielding performance and prevent deterioration thereof despite various shape changes. Since heat dissipation performance is excellent, heat generated in an electromagnetic wave source can be rapidly conducted and released. Even if parts are provided in a narrow area at high density, the material can be brought in close contact with mounted parts by overcoming a tight space between the parts and a stepped portion. The invention is employed for light, thin, short, and small or flexible devices.

14 Claims, 6 Drawing Sheets

(56) References Cited

FOREIGN PATENT DOCUMENTS

| KR | 20120024271 A | 3/2012 |
|---|---|---|
| KR | 20120086540 A | 8/2012 |
| KR | 20130132754 A | 12/2013 |
| KR | 20150007827 A | 1/2015 |
| KR | 20150106273 A | 9/2015 |
| KR | 101573900 B1 | 12/2015 |
| KR | 20160005231 A | 1/2016 |
| KR | 20160115082 A | 10/2016 |

OTHER PUBLICATIONS

Machine translation for KR2012-0086540, 19 pages, translated on Apr. 8, 2022 (Year: 2012).*

Park et al., "Fabrication and Application of Conducting Nanofibers by Electrospinning", Electrospinning, vol. 16, No. 3, 2013, pp. 67-80, English Abstract.

Lee et al., "Preparation and Characterization of PVDF/PU Bicomponent Nanofiber by Electrospining", Textile Science and Engineering, 2015, 52, pp. 88-96. English Abstract.

* cited by examiner

[Fig.1]
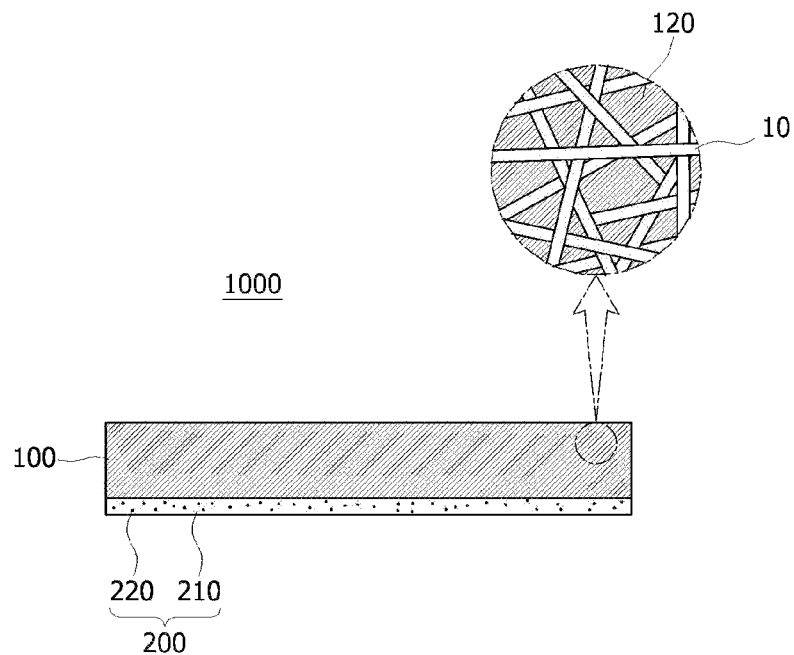

[Fig.2]
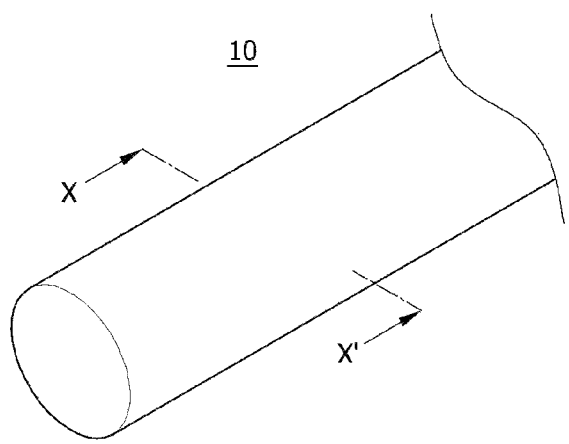
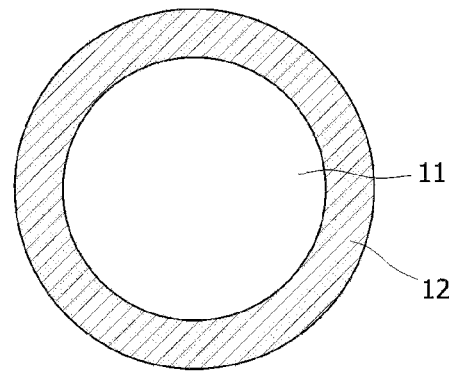
X-X'

【Fig.3a】
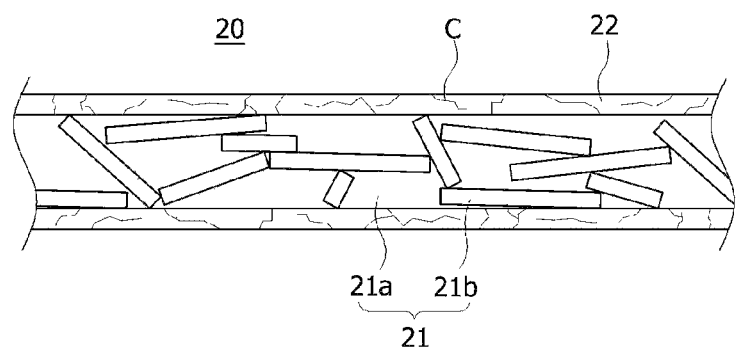
【Fig. 3b】
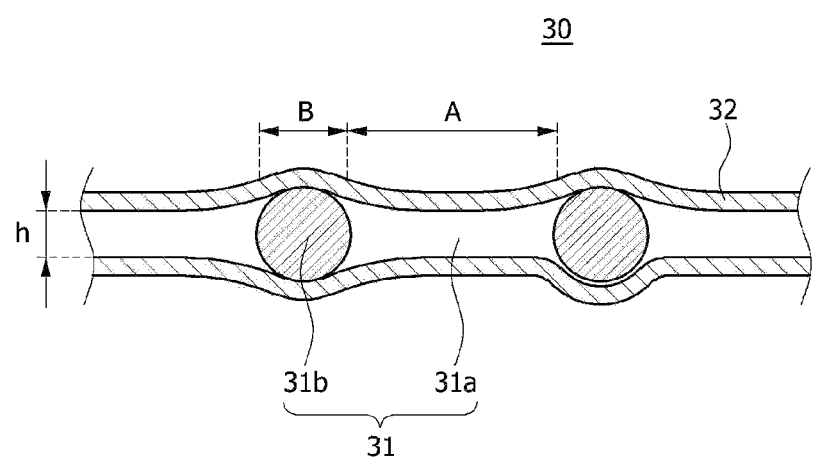

[Fig. 4a]
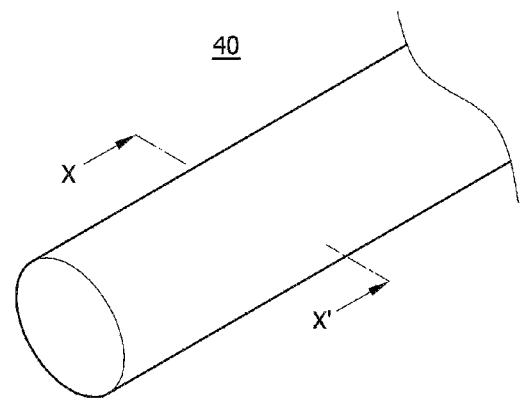
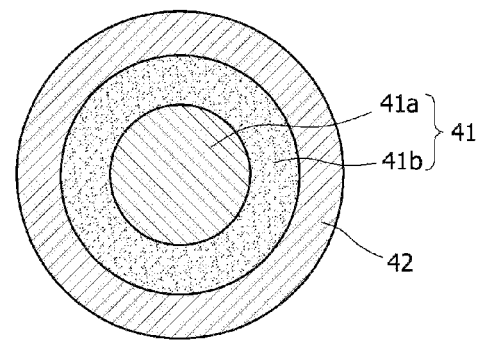
X-X'

【Fig. 4b】
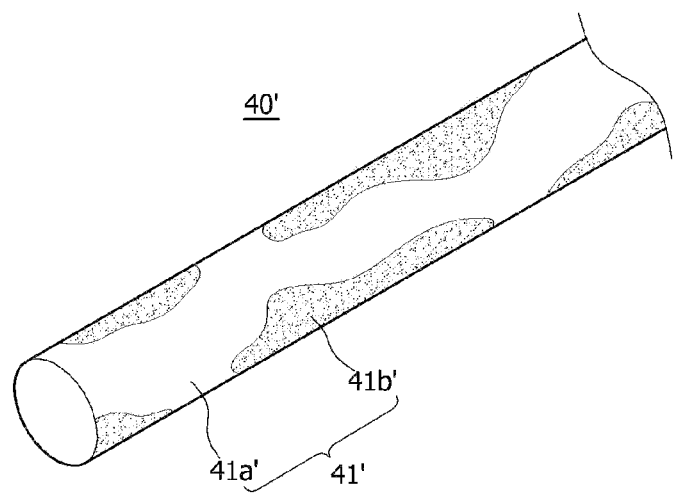
【Fig. 5】
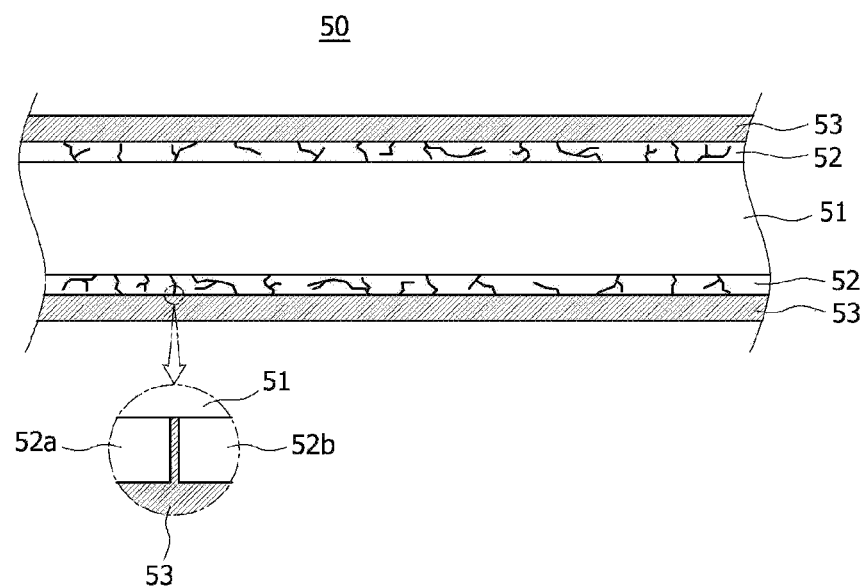

[Fig. 6]
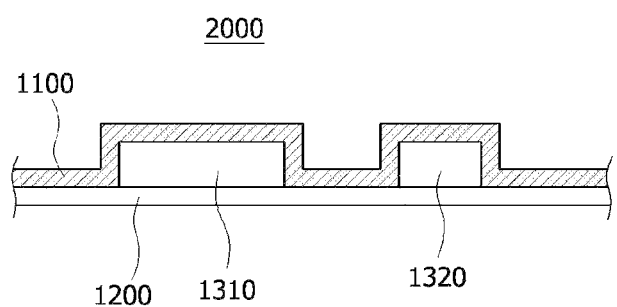

FLEXIBLE ELECTROMAGNETIC WAVE SHIELDING MATERIAL, ELECTROMAGNETIC WAVE SHIELDING-TYPE CIRCUIT MODULE COMPRISING SAME AND ELECTRONIC DEVICE FURNISHED WITH SAME

CROSS REFERENCE TO RELATED APPLICATION

This application is a 35 U.S.C. 371 National Phase Entry Application from PCT/KR2017/014553, filed Dec. 12, 2017, which claims the benefit of Korean Patent Application Nos. 10-2016-0169490 filed Dec. 13, 2016 and 10-2017-0170429 filed on Dec. 12, 2017, the disclosures of which are incorporated herein in their entirety by reference.

TECHNICAL FIELD

The present invention relates to an electromagnetic wave shielding material, and more particularly, to a flexible electromagnetic wave shielding material having excellent flexibility, elasticity, and creasing/recovery and also capable of exhibiting heat dissipation performance and electromagnetic wave shielding performance, an electromagnetic wave shielding-type circuit module including the same, and an electronic device having the same.

BACKGROUND

Electromagnetic radiation is a phenomenon in which energy moves in a sinusoidal waveform while an electric field and a magnetic field cooperate with each other, and the phenomenon is useful for wireless communication or electronic devices such as a radar. The electric field is generated by voltage and is easily shielded due to long distances or obstacles such as a tree while the magnetic field is generated by current and is inversely proportional to a distance but is not easily shielded.

A recent electronic device is sensitive to electromagnetic interference (EMI) generated by an internal or external interference source, and there is a possibility of a malfunction of the electronic device being caused by electromagnetic waves. Also, a user who is using an electronic device may be harmfully affected by electromagnetic waves generated by the electronic device.

Accordingly, there is a growing interest in electromagnetic wave shielding materials for protecting human bodies or components of an electronic device against electromagnetic waves emitted from an electromagnetic wave generation source or from an external source.

Such an electromagnetic wave shielding material is typically formed of a conductive material, and shields electromagnetic waves emitted toward the electromagnetic wave shielding material by reflecting the electromagnetic waves or directing the electromagnetic waves to the ground. An example of the electromagnetic wave shielding material may be a metal case or a metal plate. Here, it is difficult for the electromagnetic wave shielding material to exhibit flexibility and elasticity and it is not easy to change the electromagnetic wave shielding material to various shapes or to recover the electromagnetic wave shielding material once manufactured. Thus, it is difficult for the electromagnetic wave shielding material to be employed in various application fields. In particular, it may be difficult for the electromagnetic wave shielding material such as a metal plate or a metal thin film to fully exhibit electromagnetic wave shielding performance because it is difficult for the electromagnetic wave shielding material to be adhered to a component requiring protection from an electromagnetic wave generating component or an electromagnetic wave source without a gap therebetween and also a crack may be generated due to bending at a stepped portion or an uneven portion.

In order to solve such a problem, an electromagnetic wave shielding material obtained by forming a conductive coating layer on a lightweight supporting member such as a polymer film has been recently produced. However, the electromagnetic wave shielding material has limitation on electromagnetic wave shielding performance in accordance with the limitation of an available area of the supporting member to be coated. Also, a film having a certain thickness or greater is insufficiently flexible, and thus it may be difficult to fully adhere the film to components having a stepped portion or an uneven portion or it may be difficult to freely change the shape of the film once manufactured in a specific shape. Even when the shape change is possible, a crack, a delamination, or the like may frequently be generated in a covered conductive coating layer during the shape change.

Meanwhile, heat as well as electromagnetic waves is typically generated in electronic elements that generate electromagnetic waves. Therefore, when such an element is shielded by an electromagnetic wave shielding material, heat generated from the element is difficult to release to the outside, and thus the function or durability of the element may be deteriorated.

SUMMARY OF THE INVENTION

The present invention is designed to solve the above problems and is directed to providing a flexible electromagnetic wave shielding material that is so excellent in flexibility, elasticity, and creasing/recovery that the flexible electromagnetic wave shielding material is capable of being changed in shape freely at his/her disposal and thus can be brought in complete contact with various shapes/structures, such as an uneven portion or a stepped portion, of a surface to which the flexible electromagnetic wave shielding material will be applied.

Also, the present invention is also directed to providing a flexible electromagnetic wave shielding material capable of preventing deterioration of electromagnetic wave shielding performance despite various shape changes.

Furthermore, the prevent invention is also directed to providing a flexible electromagnetic wave shielding material having excellent heat dissipation performance as well as electromagnetic wave shielding performance so that the flexible electromagnetic wave shielding material can be easily employed by various element components having electromagnetic wave and heat dissipation issues.

In addition, the present invention is also directed to providing an electromagnetic wave shielding-type circuit module capable of being easily employed for a light, thin, short, and small or flexible electronic device having components provided in a small area at a high density or having elements with heat dissipation issues, and an electronic device having the same.

In order to solve the above-described problems, there is provided a flexible electromagnetic wave shielding material including a conductive fiber web including multiple pores; and a heat dissipation unit provided in at least some of the pores.

According to an embodiment of the present invention, the heat dissipation unit may include one or more of a phase-change material and a thermally conductive filler. In this case, the thermally conductive filler may include one or more of one or more conductive heat dissipation fillers selected from the group consisting of a carbon nanotube such as a single-wall carbon nanotube, a double-wall carbon nanotube, and a multi-wall carbon nanotube, graphene, graphene oxide, graphite, carbon black, nickel, silver, copper, iron, gold, aluminum, titanium alloys, platinum, chromium, and a carbon-metal complex and one or more insulating heat dissipation fillers selected from the group consisting of silicon carbide, magnesium oxide, titanium dioxide, aluminum nitride, silicon nitride, boron nitride, aluminum oxide, silica, zinc oxide, barium titanate, strontium titanate, beryllium oxide, manganese oxide, zirconia oxide, and boron oxide.

Also, the conductive fiber web may include a conductive composite fiber including a fiber part including a fiber forming component and a conductive part covering an outside of the fiber part.

Also, the fiber part may further include a conductive filler. In this case, the conductive filler may contain one or more of one or more types of metals selected from the group consisting of aluminum, nickel, copper, silver, gold, chromium, platinum, titanium alloys, and stainless steel, and conductive polymer compounds.

Also, the conductive part may contain one or more of one or more types of metals selected from the group consisting of aluminum, nickel, copper, silver, gold, chromium, platinum, titanium alloys, and stainless steel, and conductive polymer compounds.

Also, the conductive polymer compounds may include one or more types selected from the group consisting of polythiophene, poly(3,4-ethylenedioxythiophene), polyaniline, polyacetylene, polydiacetylene, poly(thiophenevinylene), polyfluorene, and poly(3,4-ethylenedioxythiophene)(PEDOT): polystyrene sulfonate (PSS).

Also, the conductive part may include a first conductive part and a second conductive part sequentially covering an outer surface of the fiber part, and the second conductive part may intentionally cover and infiltrate into a crack formed in the first conductive part in order to prevent deterioration of physical properties caused by the crack generated after elongation.

Also, the conductive composite fiber may have a diameter of 0.2 μm to 10 μm.

Also, the conductive fiber web may have a thickness of 5 μm to 200 μm and a basis weight of 5 g/m² to 100 g/m².

Also, 11 to 900 parts by weight of the heat dissipation unit may be included with respect to 100 parts by weight of the conductive fiber web.

Also, the conductive part may have a thickness of 0.1 μm to 2 μm.

Also, the conductive fiber web may have a porosity of 30% to 80%.

Also, a conductive adhesive layer may be provided on at least one surface of the conductive fiber web.

Also, the fiber forming component of the fiber part may contain one or more types selected from the group consisting of polyurethane, polystyrene, polyvinylalcohol, polymethyl methacrylate, polylactic acid, polyethylene oxide, polyvinyl acetate, polyacrylic acid, polycaprolactone, polyacrylonitrile, polyvinylpyrrolidone, polyvinylchloride, polycarbonate, polyetherimide, polyethersulphone, polybenzimidazole, polyethylene terephthalate, polybutylene terephthalate, and fluorine-based compounds. In this case, preferably, the fiber part may contain polyvinylidene fluoride (PVDF) and polyurethane at a weight ratio of 1:0.2 to 1:2.0 as the fiber forming component.

Also, the heat dissipation unit may be located inside the conductive fiber web, and the heat dissipation unit may not be placed on all or a portion of an outer surface of the conductive fiber web, thus preventing unexpected deterioration of the electromagnetic wave shielding performance due to the heat dissipation unit.

Also, the present invention provides an electromagnetic wave shielding-type circuit module including a circuit board with an element mounted thereon; and the electromagnetic wave shielding material according to the present invention provided on the circuit board to cover at least an upper portion and a lateral portion of the element.

Also, the present invention provides an electronic device including the electromagnetic wave shielding-type circuit module according to the present invention.

ADVANTAGEOUS EFFECTS OF THE INVENTION

The electromagnetic wave shielding material according to the present invention is so excellent in flexibility, elasticity, and creasing/recovery that the electromagnetic wave shielding material can be changed in shape freely at his/her disposal and thus can be brought in complete contact with a surface where the electromagnetic wave shielding material is intended to be disposed even if the surface has a curved shape such as an uneven portion or a stepped portion, thus exhibiting excellent electromagnetic wave shielding performance. Also, it is possible to prevent deterioration of the electromagnetic wave shielding performance despite various shape changes. Further, since heat dissipation performance is excellent, heat generated in an electromagnetic wave source can be rapidly conducted and released. Furthermore, even if parts are provided in a narrow area at a high density, the electromagnetic wave shielding material can be brought in close contact with mounted parts by overcoming a tight space between the parts and a stepped portion. Thus, the present invention may be easily employed for a light, thin, short, and small or flexible electronic device.

DESCRIPTION OF THE DRAWINGS

FIG. 1 is a sectional view of a flexible electromagnetic wave shielding material according to an embodiment of the present invention.

FIG. 2 is a sectional view of a conductive composite fiber included in an embodiment of the present invention.

FIGS. 3A and 3B are sectional views of several conductive composite fibers included in an embodiment of the present invention.

FIG. 4A shows a partial perspective view of a conductive composite fiber included in another embodiment of the present invention in which a conductive polymer compound is disposed in a surface portion of a fiber part and a sectional view taken along a boundary line X-X'.

FIG. 4B is a partial perspective view of a fiber part in which a conductive part is not shown from a conductive composite fiber included in another embodiment of the present invention.

FIG. 5 shows a partial perspective view of a conductive composite fiber included in another embodiment of the present invention and a sectional view taken along a boundary line X-X'.

FIG. 6 is a sectional view of an electromagnetic wave shielding-type circuit module according to an embodiment of the present invention.

Hereinafter, embodiments of the present invention will be described in detail with reference to the accompanying drawings so that they can be easily carried out by those skilled in the art. The present invention may, however, be embodied in many different forms and should not be construed as being limited to the embodiments set forth herein. In the accompanying drawings, portions irrelevant to the description of the present invention will be omitted for clarity. Moreover, like reference numerals refer to like elements throughout.

Referring to FIG. 1, a flexible electromagnetic wave shielding material 1000 according to an embodiment of the present invention may include a conductive fiber web 100 including multiple pores and a heat dissipation unit 120 provided in some or all of the pores and may further include a conductive adhesive layer 200 provided one or both surfaces of the conductive fiber web 100.

The conductive fiber web 100 has a three-dimensional network structure and includes multiple pores. The multiple pores may be formed by being surrounded by conductive composite fibers 10, which are used as an example of forming the conductive fiber web 100. The conductive fiber web 100 may have a porosity of 30% to 80%. Thus, the conductive fiber web 100 may be easily implemented as a flexible electromagnetic wave shielding material with good elasticity, and the heat dissipation unit 120 may be provided in the pores of the conductive fiber web 100 in an appropriate content. Also, the conductive fiber web 100 may have an air permeability of 0.01 cfm to 2 cfm. When the air permeability is less than 0.01 cfm and a conductive adhesive layer is formed on one surface of the conductive fiber web, it may be difficult to impregnate a conductive adhesive layer forming composition into the pores of the fiber web. When the air permeability exceeds 2 cfm, the mechanical properties and electromagnetic wave shielding performance of the conductive fiber web may be deteriorated.

Also, the conductive fiber web 100 may have a thickness of 5 μm to 200 μm and a basis weight of 5 g/m² to 100 g/m². When the thickness of the conductive fiber web exceeds 200 μm, it may not be easy to form a conductive part of a conductive composite fiber, which is used as an example of forming the conductive fiber web 100, on a fiber included in the entire area outside and inside the fiber web, and also the elastic properties may be deteriorated. Also, when the thickness is less than 5 μm, the mechanical strength of the conductive fiber web may be deteriorated, the handling may become difficult, and the manufacturing may not be easy.

In order to satisfy an appropriate thickness, the conductive fiber web may be formed as a single conductive fiber web or by stacking a plurality of conductive fiber webs. When the plurality of conductive fiber webs are stacked, a conductive adhesive layer for bonding the conductive fiber webs to one another may further be interposed therebetween. The subsequent description of the conductive adhesive layer 200 may be applied to the conductive adhesive layer, and thus a description thereof will be omitted.

Also, when the basis weight of the conductive fiber web 100 is less than 5 g/m², the mechanical strength of the conductive fiber web may be lowered, the handling may become difficult, and the manufacturing may not be easy. When the basis weight exceeds 100 g/m², it may not be easy to form the conductive part of the conductive composite fiber on the fiber included in the entire area outside and inside the fiber web, and the elastic properties may be deteriorated.

The conductive composite fiber 10, which is an example for forming the above-described conductive fiber web 100, may include a fiber part 11 including a fiber forming component and a conductive part 12 covering an outside of the fiber part 11, as shown in FIG. 2.

The fiber forming component provided in the fiber part 11 is an entity that forms a fiber or a fiber web in a conductive composite fiber or a conductive fiber web. The fiber forming component allows exhibition of elasticity, flexibility, and creasing/recovery of the fiber web. A well-known polymer compound that may be typically formed in a fibrous shape may be used as the fiber forming component without limitation. As an example, the fiber forming component may contain one or more types selected from the group consisting of polyurethane, polystyrene, polyvinylalcohol, polymethyl methacrylate, polylactic acid, polyethylene oxide, polyvinyl acetate, polyacrylic acid, polycaprolactone, polyacrylonitrile, polyvinylpyrrolidone, polyvinylchloride, polycarbonate, polyetherimide, polyethersulphone, polybenzimidazole, polyethylene terephthalate, polybutylene terephthalate, and fluorine-based compounds. Also, the fluorine-based compound may include at least one compound selected from the group consisting of polytetrafluoroethylene (PTFE)-based compounds, tetrafluoroethylene-perfluoroalkyl vinyl ether copolymer (PFA)-based compounds, tetrafluoroethylene-hexafluoropropylene copolymer (FEP)-based compounds, tetrafluoroethylene-hexafluoropropylene-perfluoroalkyl vinyl ether copolymer (EPE)-based compounds, tetrafluoroethylene-ethylene copolymer (ETFE)-based compounds, polychlorotrifluoroethylene (PCTFE)-based compounds, chlorotrifluoroethylene-ethylene copolymer (ECTFE)-based compounds, and polyvinylidene fluoride (PVDF)-based compounds. Preferably, the fiber part 11 may be obtained by blending and then spinning PVDF, which is a fluorine-based compound, and polyurethane in a spinning solution in order for the conductive fiber web 100 to exhibit enhanced elasticity, flexibility, heat resistance, chemical resistance, and mechanical strength. In this case, the PVDF and the polyurethane may be contained at a weight ratio of 1:0.2 to 1:2 and preferably 1:0.4 to 1:1.5. When the weight of the polyurethane is less than 0.2 times the weight of the PVDF, the flexibility, elasticity, and the like may be deteriorated. As a result, when the conductive fiber web is provided on a substrate having a stepped portion or a change in shape during use, the conductive fiber web may be torn or difficult to bring into close contact with the stepped portion, and also electromagnetic wave shielding performance may be more deteriorated than initially designed, due to damage to the conductive fiber web. Also, when the weight of the polyurethane is more than two times the weight of the PVDF, a recovery force is lowered due to elongation or contraction, and thus upon elongation or contraction, a permanent shape change may be induced due to a failure to recover its original state before elongation or contraction. As a result, the deterioration of the electromagnetic wave shielding performance may be induced because a separation distance of a crack generated due to the permanent shape change cannot be reduced. Also, the chemical resistance may be significantly deteriorated, and thus the fiber part may be damaged while a metal shell part is being formed. Accordingly, the deterioration of the mechanical properties, such as yarn breakage of the fiber part or tearing of the fiber web, may occur due to the shape change such as the elongation/contraction, creasing, and the like of the conductive fiber web.

The fiber part 11 may further include a metallic conductive filler 21b as shown in FIG. 3A, in order to further reduce the resistance of the conductive fiber web 100 and minimize an increase in resistance in the length direction and/or the thickness direction of the composite fiber due to an unintended crack of the conductive part. Due to elongation/contraction, creasing, and the like of the electromagnetic wave shielding material, a crack c may be generated in a conductive part 22 of a conductive composite fiber 20. The generated crack c may increase the resistance of the conductive composite fiber 20 and ultimately may induce the deterioration of the electromagnetic wave shielding performance. However, the conductive filler 21b provided in the conductive composite fiber 20 may provide electrical connection to the conductive part 22 with the generated crack c, thus minimizing or preventing an increase in resistance. In particular, when the conductive part 22 of the conductive composite fiber 20 is made of a metal, a crack may be very easily generated. Accordingly, it is possible to minimize the increase in resistance through the conductive filler 21b and exhibit an increase in electromagnetic wave shielding performance due to electrical connection between conductive fillers.

Any well-known material with electrical conductivity may be used as the metallic conductive filler 21b without limitation. As a non-limiting example, the electrically conductive material may include one or more types of metals selected from the group consisting of aluminum, nickel, copper, silver, gold, chromium, platinum, titanium alloys and stainless steel.

In this case, when the conductive filler 21b is made of a metal, the conductive filler 21b may be provided to occupy 10 to 50% of the total volume of the fiber part. When the volume of the conductive filler is less than 10% of the total volume of the fiber part, it may be difficult to prevent a decrease in resistance due to the connection between conductive fillers or an increase in resistance of the metal shell part with the crack generated therein. Also, when the volume of the conductive filler is more than 50% of the total volume of the fiber part, yarn breakage of the fiber part may be significantly increased when the fiber part is being spun, and the mechanical strength may be significantly lowered even when implementation is made using a fiber web.

Also, the conductive filler 21b has no limitation in terms of shape and may have a well-known shape such as a curved spherical, acicular or irregular shape employed without limitation. However, the conductive filler 21b may have a rod shape with a predetermined aspect ratio in order to prevent an increase in resistance due to a crack of the conductive part 22 that may be generated due to the shape change of the conductive fiber web. In this case, the aspect ratio may range from 1.1 to 20. When the aspect ratio is less than 1.1, the contact between the conductive fillers may become difficult, and the direct contact with the metal shell part with the crack generated therein may also become difficult. Also, the content of the fillers in the fiber part should be increased in order to induce the direct contact, but in this case, the mechanical strength of the conductive composite fiber may be significantly lowered. Also, when the aspect ratio exceeds 20, the conductive filler may penetrate through the fiber part and damage the metal shell part when the composite fiber is bent. This may result in deterioration of electromagnetic wave shielding performance. As an example, the rod-shaped conductive filler may have a diameter of 0.8 μm to 1.1 μm and a length of 1 μm to 5 μm.

Also, when the conductive filler 21b is made of a metal, the conductive filler 21b may have a cross section having an outer periphery with a curved shape such as a circle or an ellipse, a regular shape including a polygon such as a quadrangle or a pentagon, or an irregular shape. Alternatively, when the conductive filler has an aspect ratio, the conductive filler may have a longitudinal section having an outer periphery with a regular shape or an irregular shape, and also a longitudinally continuous hollow portion. In this case, advantageously, the conductive filler having the hollow portion may allow exhibition of more excellent elastic properties of and lightening of the conductive fiber web.

When such conductive fillers are densely arranged on an inner side of the fiber part and are not exposed on an outer surface of the fiber part, it may be difficult to prevent an increase in resistance due to a crack of the metal shell part. Accordingly, it is preferable that the conductive filler is as closely arranged on the outer surface of the fiber part as possible. In this case, it i not easy to adjust the position of the conductive filler while a spinning solution containing the conductive filler is spun. As a result, according to an embodiment of the present invention, the conductive filler may have a larger diameter than the fiber being spun so that the conductive filler may be as closely placed on the outer surface of the fabric part as possible.

In detail, referring to FIG. 3B, when a conductive filler 31b is made of a metal, a fiber part 31 may include a first part B having the conductive filler 31b made of the metal and a second part A not having the conductive filler 31b in the length direction of a conductive composite fiber 30. By setting the ratio of a diameter h of the second part A to a diameter of the conductive filler 31b to be 1:1 to 1:5 and preferably 1:2.5 to 1:5 to increase the possibility of the conductive filler 31b being exposed to the outer surface of the fiber part 31, it is possible to increase the possibility of contact with a conductive part 32 and also to prevent an increase in resistance through the conductive filler 31b despite a crack generated in the conductive part 32. When the diameter of the conductive filler is less than one time the diameter of the second part, the possibility of the conductive filler being exposed to the outside of the fiber part is decreased, and thus it is not possible to minimize the increase in resistance due to a crack or the like generated in the conductive part. Also, when the diameter of the conductive filler is more than five times the diameter of the second part, yarn breakage may occur during fiber spinning or the mechanical strength of the implemented composite fiber or fiber web may be lowered. In addition, when the conductive fiber web is changed in shape, the shape transformation range due to the contact between the conductive fillers may be further decreased.

Also, when the conductive filler 31b has a shape with an aspect ratio, the diameter of the conductive filler 31b corresponding to the second part A may be a short axis length.

According to an embodiment of the present invention, the diameter of the conductive filler may range from 1 μm to 5 μm. Thus, the possibility of exposure to the outside of the fiber part increases, and thus it is possible to prevent a decrease in electromagnetic wave shielding efficiency. When the diameter is less than 1 μm, the decrease in electromagnetic wave shielding efficiency may not be minimized. When the diameter exceeds 5 μm, yarn breakage may occur in the fiber part during fiber spinning or the mechanical strength of the fiber web may be lowered.

As shown in FIGS. 4A and 4B, the fiber part may include conductive polymer compounds 41b and 41b' as the conductive filler. The conductive polymer compound 41b may be provided in a fiber part 41 by surrounding a fiber forming component 41a (see FIG. 4A), or the conductive polymer compound 41b' may be provided in a fiber part 41' by irregularly mixing the conductive polymer compound 41b' and a fiber forming component 41a' (see FIG. 4B). In this case, the conductive polymer compound 41b may be exposed to an outer surface of the fiber part 41 as shown in FIG. 4A, or the conductive polymer compound 41b' may be at least partially exposed to an outer surface of the fiber part 41' as shown in FIG. 4B. Accordingly, a conductive part 42 may electrically communicate with the exposed conductive polymer compounds 41b and 41b', thus exhibiting more excellent electromagnetic wave shielding performance. Also, when a crack is generated in the conductive part due to the elongation/contraction, creasing, and the like of conductive composite fibers 40 and 40' or conductive fiber webs, electrical connection may be made in the gap of the crack of the conductive part through the conductive polymer compounds 41b and 41b' exposed to the outer surfaces of the fiber parts. Thus, it is possible to further prevent deterioration of the electromagnetic wave shielding performance.

A well-known polymer compound with electrical conductivity may be used as the conductive polymer compounds 41b and 41b' without limitation. As an example, a polymer resin including an electron withdrawing group may be used. The electron withdrawing group is also called an electron attracting group and refers to an atomic group that attracts electrons from nearby atomic groups by a resonance effect or an induction effect. The electron withdrawing group may include at least one of an oxadiazole group, an azole group, a benzothiadiazole group, a cyano group, a quinoline group, a boronyl group, a silyl group, a perfluorinated group, a halogen group, a nitro group, a carbonyl group, a carboxyl group, a nitrile group, a halogenated alkyl group, an amino group, and a sulfonyl group. As an example of having the electron withdrawing group, the conductive polymer compound may include one or more types selected from the group consisting of polythiophene, poly(3,4-ethylenedioxythiophene), polyaniline, polyacetylene, polydiacetylene, poly(thiophenevinylene), polyfluorene, and poly(3,4-ethylenedioxythiophene)(PEDOT): polystyrene sulfonate (PSS).

Also, when the conductive fillers 41b and 41b' are conductive polymer compounds, the conductive fillers 41b and 41b' may be provided in an amount of 25 to 400 parts by weight and preferably 90 to 400 parts by weight with respect to 100 parts by weight of the fiber forming component of the fiber part. When the conductive fillers are provided in an amount of less than 25 parts by weight with respect to the fiber forming component, it may be difficult to exhibit the electromagnetic wave shielding performance at a desired level or to electrically connect all the cracked portions when a crack is generated in the metal shell part. Thus, it may be difficult to maintain the electromagnetic wave shielding performance. Also, when the conductive fillers are provided in an amount of more than 400 parts by weight, the mechanical strength of the composite fiber may be lowered, and the spinning properties may be significantly deteriorated when the fiber part is manufactured.

Next, the conductive parts 11, 22, 32, and 42 function to lower the resistance of the conductive fiber web to exhibit the electromagnetic wave shielding performance. A typical material with electrical conductivity may be used as the conductive parts 12, 22, 32, and 42 without limitation. As an example, the conductive parts 12, 22, 32, and 42 may be made of one or more types of metals selected from the group consisting of aluminum, nickel, copper, silver, gold, chromium, platinum, titanium alloys, and stainless steel. In this case, the metal conductive parts 12, 22, 32, and 42 may be formed of three layers consisting of a nickel layer, a copper layer, and a nickel layer. In this case, the copper layer allows the conductive fiber web to have low electrical resistance, thereby exhibiting excellent electromagnetic wave shielding performance, minimizing a crack in the metal shell part even during shape change, such as creasing and elongation/contraction, of the conductive fiber web, and also improving the elastic properties. Also, the nickel layer formed on the copper layer can prevent oxidation of the copper layer, thereby preventing deterioration of the electromagnetic wave shielding performance.

Also, the conductive parts 12, 22, 32, and 42 may be conductive polymer compounds. The description of the conductive polymer compounds is the same as that of the above-described conductive polymer compound that may be provided in the fiber part, and thus a detailed description thereof will be omitted.

Also, the conductive parts 12, 22, 32, and 42 may have a thickness of 0.1 µm to 2 µm. When the thickness of the conductive parts exceeds 2 µm, a crack and a delamination may be easily generated when the shape change is made due to bending of the conductive composite fiber. When the thickness is less than 0.1 µm, it may be difficult to exhibit the electromagnetic wave shielding performance at a desired level, and the shielding performance may be further decreased due to an increase in occurrence of delaminations during elongation or contraction.

Meanwhile, as shown in FIG. 5, a conductive composite fiber 50 may be implemented with a first conductive part 52 and a second conductive part 53 sequentially covering an outside of a fiber part 51. The first conductive part 52 may induce an increase in resistance when a crack is generated due to elongation/contraction or creasing of the electromagnetic wave shielding material. Accordingly, in order to prevent the induction of the resistance increase, the second conductive part 53 may be allowed to infiltrate into gaps of first conductive parts 52a and 52b with cracks generated therein when the conductive composite fiber 50 is manufactured, by elongating the fiber in the length direction after formation of the first conductive part 52 to generate a crack in the first conductive part 52 and forming the second conductive part 53 on the first conductive part 52 while the fiber is elongated. A final desired resistance value may be designed by intentionally generating a crack in the first conductive part 52 in the manufacturing process for the electromagnetic wave shielding material and infiltrating the second conductive part 53 into a gap of the crack to provide electrical connection to the gap so that the increase in resistance caused by breakages of the first conductive parts 52a and 52b due to the crack is offset. Thus, advantageously, it is possible to reduce or prevent a fluctuation in physical properties due to an additional crack of the conductive part generated in an elongation process during use from the manufacturing stage. Also, advantageously, the crack intentionally generated in the first conductive part 52 may allow the electromagnetic wave shielding material to have higher flexibility by increasing the flexibility of the conductive composite fiber 50. In this case, the first conductive part 52 may be made of a metal in which a crack may be easily generated, and the second conductive part 53 may be made of a conductive polymer compound.

Also, the first conductive part 52 may have a thickness of preferably 0.1 µm to 2 µm and more preferably 0.1 µm to 1.0 µm. Also, the second conductive part 53 may have a thickness of 0.05 µm to 1 µm.

When the thickness of the first conductive part exceeds 2 µm, an additional crack and delamination are easily generated when a shape change is made due to bending of the conductive composite fiber or the like, in addition to the intentionally generated crack. When the thickness is less than 0.1 µm, a delamination is significantly generated along the intentionally generated crack. Thus, the initial electromagnetic wave shielding performance may not be exhibited at a desired level even after the second conductive part is formed, and a fluctuation in the electromagnetic wave shielding performance may increase due to elongation or the like occurring during use.

Also, the second conductive part may have a thickness of 0.05 µm to 1 µm. When the thickness of the second conductive part is less than 0.05 µm, it may be difficult to prevent an increase in resistance due to the first conductive part with the crack generated therein, and also it may be difficult for the second conductive part to sufficiently fill the gap of the crack. Also, when the thickness of the second conductive part exceeds 1 µm, the electrical resistance of the conductive fiber web may suddenly increase due to the somewhat high electrical resistance of the conductive polymer compound despite the presence of the first conductive part, and thus it may be difficult to exhibit electromagnetic wave shielding performance at a desired level. Also, along with the increase in thickness of the second conductive part, the flexibility and the elongation properties may be deteriorated, and thus the conductive fiber web may be torn by an external force generated during use.

The conductive composite fibers 10, 20, 30, 40, 40', and 50 may have a diameter of 0.2 µm to 10 µm. When the diameter is less than 0.2 µm, the handling properties may be deteriorated, and the manufacturing may not be easy. When the diameter exceeds 10 µm, the elasticity and the electromagnetic wave shielding performance may be deteriorated.

The heat dissipation unit 120 may be provided in some or all of multiple pores provided in the conductive fiber web 100 formed of the above-described conductive composite fibers 10, 20, 30, 40, 40', and 50. The heat dissipation unit 120 functions to transfer and emit heat generated from an element surrounded by the electromagnetic wave shielding material 1000 to the outside. Any well-known material capable of exhibiting heat dissipation performance may be used as the heat dissipation unit 120 without limitation. As an example, the heat dissipation unit may contain a phase-change material and a thermally conductive filler.

The phase-change material may release heat to the outside by using a change in phase, i.e., a change from a solid phase or a semi-solid phase to a semi-solid phase and/or a liquid phase caused by the heat generated in the element. In detail, heat absorbed or released when a substance is transformed in phase, i.e., when a substance changes from a solid to a liquid (or from a liquid to a solid) or from a liquid to a gas (or from a gas to a liquid) is called latent heat. Since the latent heat is much larger than sensible heat, i.e., heat absorbed (or released) according to a change in temperature while a phase transition does not occur, using the latent heat may be advantageous in achieving a significant heat dissipation effect.

Any well-known phase-change material may be used as the phase-change material. Therefore, the present invention has no particular limitation thereon. As an example, the phase-change material may include one or more types selected from the group consisting of linear aliphatic hydrocarbon, hydrated inorganic salt, polyhydric alcohol, higher fatty acid, alcohol fatty acid ester, and polyether. The linear aliphatic hydrocarbon may be an n-paraffinic saturated hydrocarbon or a saturated hydrocarbon with 10 to 36 carbon atoms. Also, the hydrated inorganic salt may include one or more types of hydrates of inorganic salts such as calcium chloride, potassium chloride, sodium sulfate, sodium acetate, sodium phosphate, sodium carbonate, sodium thiosulfate, potassium hydroxide, barium hydroxide, lithium nitrate, and zinc nitrate. Also, the polyhydric alcohol may be a glycol with 2 to 20 carbon atoms (a divalent alcohol) or a glycerol with 2 to 20 carbon atoms (a trivalent alcohol). Also, the higher fatty acid may be a compound with 5 or more carbon atoms and preferably 10 or more carboxyl groups and may include stearic acid, palmitic acid, lactic acid, and the like. Also, the alcohol fatty acid ester may be an ester obtained by esterifying the above-described polyhydric alcohol with fatty acid. As an example, the alcohol fatty acid ester may be wax, beeswax, or the like. Also, the polyether may be polyhydric alcohol, for example, polyethylene glycol polymerized with ethylene glycol. In this case, the molecular weight of the polyethylene glycol can be designed differently depending on the melting point of the desired phase-change material, and is not particularly limited in the present invention. However, preferably, the weight-average molecular weight may be 500 to 5000.

Also, the phase-change material included in an embodiment of the present invention may have a melting point of 10° C. to 60° C., but the present invention is not limited thereto. The melting point may be designed differently depending on a desired degree of heat dissipation and a temperature of an electromagnetic wave source.

Also, the heat dissipation unit 120 may include a thermally conductive filler. The thermally conductive filler may include one or more types of a metal filler, a ceramic filler, and a carbon-based filler. However, the thermally conductive filler may preferably have both thermal conductivity and electrical conductivity in order to simultaneously exhibit improved electromagnetic wave shielding performance.

The metal filler may include one or more types of well-known metal fillers such as Al, Ag, Cu, NI, Fe, Pt, Au, Cr, Ti alloys, In—Bi—Sn alloys, Sn—In—Zn alloys, Sn—In—Ag alloys, Sn—Ag—Bi alloys, Sn—Bi—Cu—Ag alloys, Sn—Ag—Cu—Sb alloys, Sn—Ag—Cu alloys, Sn—Ag alloys, and Sn—Ag—Cu—Zn alloys. The ceramic filler may include one or more types of well-known ceramic fillers such as AlN, $Al_2O_3$, BN, MgO, SiC, and BeO. The carbon-based filler may include one or more types of well-known carbon-based fillers such as carbon nanotubes such as single-walled carbon nanotubes, double-walled carbon nanotubes, and multi-walled carbon nanotubes, graphene, graphene oxide, graphite, and carbon black.

When insulating properties in the direction of one surface of the electromagnetic wave shielding material is required, an insulating heat dissipation filler may be included in a pore exposed on one surface of the electromagnetic wave shielding material or an inner pore located close to the surface. Any well-known insulating heat dissipation filler may be used as the insulating heat dissipation filler without limitation. As an example, one or more insulating heat dissipation fillers selected from the group consisting of silicon carbide, magnesium oxide, titanium dioxide, aluminum nitride, silicon nitride, boron nitride, aluminum oxide, silica, zinc oxide, barium titanate, strontium titanate, beryllium oxide, manganese oxide, zirconia oxide, and boron oxide may be used.

Also, the thermally conductive filler may have a particle diameter of 10 nm to 5 µm, but the present invention is not limited thereto. The particle diameter may be appropriately selected in consideration of the diameter of the pores of the conductive fiber web. Also, it should be noted that any well-known shape such as a plate shape, a spherical shape, and an irregular shape may be used as the shape of the thermally conductive filler without limitation.

Also, according to an embodiment of the present invention, a phase-change material and a thermally conductive filler may be provided in the pores of the conductive fiber web in a semi-solid phase as the heat dissipation unit 120. When the phase-change material and the thermally conductive filler are provided in a liquid phase, the phase-change material and the thermally conductive filler are difficult to consistently provide in the pores of the conductive fiber web. When the phase-change material and the thermally conductive filler are provided in a solid phase, the elastic and flexible properties of the conductive fiber web may be deteriorated. Accordingly, the phase-change material itself may be made of a semi-solid material so that the phase-change material can be provided in the pores of the conductive fiber web. Alternatively, the phase-change material additionally may include a semi-solid polymer compound as the heat dissipation unit so that the phase-change material mixed in the polymer compound can be provided in the pores. In addition, the thermally conductive filler may also additionally have a semi-solid polymer compound as the heat dissipation unit so that the thermally conductive filler dispersed in the polymer compound can be provided in the pores of the conductive fiber web.

Any well-known material that does not deteriorate the electrical conductivity of the conductive fiber web and the heat dissipation performance of the phase-change material and the thermally conductive filler may be used as the semi-solid polymer compound without limitation. As an example, the semi-solid polymer compound may be a thermal grease-type matrix such as a silicone-based resin. Since a well-known material may be employed, a detailed description thereof will be omitted.

The above-described heat dissipation unit 120 may be provided in an amount of 11 to 900 parts by weight with respect to 100 parts by weight of the conductive fiber web. Thus, it is possible to exhibit the heat dissipation performance at a desired level without deteriorating the elastic properties of the conductive fiber web.

Meanwhile, the heat dissipation unit 120 may be placed in the conductive fiber web 100, and may not be placed on some or all of an outer surface of the conductive fiber web. The heat dissipation unit may cause the deterioration of the electromagnetic wave shielding performance depending on the material. As an example, an insulating heat dissipation filler provided as a heat dissipation component may increase the resistance of the conductive fiber web. In addition, the thermally conductive filler with conductivity may also form a heat dissipation unit together with a polymer compound having adhesive or bonding properties. In this case, the polymer compound may cause an increase in resistance of the conductive fiber web. Thus, the heat dissipation unit 120 may be placed inside the conductive fiber web so as not to be exposed to the outside of the electromagnetic wave shielding material. Since the heat dissipation unit is placed so as not to be exposed to the entire or a portion of the outer surface of the conductive fiber web, it is possible to prevent unexpected deterioration of the electromagnetic wave shielding performance due to the heat dissipation unit by maintaining or exhibiting the conductivity of the outer surface.

The above-described electromagnetic wave shielding material according to an embodiment of the present invention may be manufactured by (1) manufacturing a conductive fiber web, and (2) providing a heat dissipation unit in at least some pores of the manufactured conductive fiber web, but the present invention is not limited thereto.

First, in step (1) according to the present invention, a conductive fiber web 100 is manufactured.

The conductive fiber web 100 may be implemented as a fiber web having a three-dimensional network structure using a manufactured conductive composite fiber 10 or may be manufactured by a method including (a) manufacturing a fiber web formed of a fiber part by spinning a spinning solution containing a fiber forming component and (2) manufacturing a conductive fiber web by forming a conductive part to cover the outside of the fiber part.

First, the former method will be described. The conductive composite fiber may be manufactured by spinning the spinning solution containing the fiber forming component through an inner nozzle of a double-spinning nozzle, extruding a metal paste capable of forming the conductive part, i.e., a conductive polymer compound paste through an outer nozzle, and then sintering the metal paste or solidifying the conductive polymer compound.

Alternatively, the conductive composite fiber may be manufactured by forming the conductive part on the outer surface of the fiber manufactured through the spinning solution containing the fiber forming component. In this case, when a solvent appropriately selected according to the spinning method, the type of the fiber forming component, and the like is additionally contained in the spinning solution, the spinning solution may be a dissolving solution in which the fiber forming component is dissolved or a melt solution in which the fiber forming component is melted. The method of spinning the spinning solution may be appropriately selected in consideration of the desired diameter of the conductive composite fiber, the desired type of the fiber forming component, and the like. As an example, the method may be a method of extruding the spinning solution through a spinneret using pressure or by electrospinning. Also, dry spinning or wet spinning may be appropriately selected in consideration of the type of the fiber forming component contained, the type of the solvent contained in the spinning solution, and the like. However, the present invention has no particular limitation thereon.

Although the above-mentioned spinning solution includes a fiber forming component, it is noted that a spinning solution additionally having a conductive filler may be used according to the purpose.

Subsequently, the method of forming the conductive part on the outer surface of the manufactured fiber may be performed through a well-known coating method, plating method, or the like. As an example, when the conductive part is made of a metal, the fiber may be immersed in the metal paste and then subjected to a drying process and/or a sintering process. Alternatively, electroless plating may be performed as the well-known plating method.

A conductive fiber web may be manufactured by applying, to the manufactured conductive composite fiber, a well-known manufacturing method for a fiber web, for example, a dry non-woven fabric such as a chemical bonding non-woven fabric, a thermal bonding non-woven fabric, and an air-ray non-woven fabric, a wet non-woven fabric, a spunlace non-woven fabric, a needle punched non-woven fabric, or a melt blown non-woven fabric.

Next, the conductive fiber web may be manufactured by another manufacturing method including (a) manufacturing a fiber web formed of a fiber part by spinning a spinning solution containing a fiber forming component and (b) manufacturing a conductive fiber web by forming a conductive part to cover the outside of the fiber part.

In step (a), the fiber web may be manufactured through a well-known spinning method. As an example, the fiber web may be manufactured by performing a calendering process on a fiber mat obtained by a collector collecting and accumulating the spun fiber forming component. Alternatively, the fiber web may be manufactured by performing a well-known fiber web manufacturing method on separately manufactured fibers.

In step (b), the conductive part is formed to cover the fiber part of the fiber web manufactured in step (a).

Subsequently, in step (b), which is a step of forming the conductive part on the outer surface of the fiber part of the manufactured fiber web, the conductive part may be formed by a well-known method. As an example, the well-known method may include immersion, deposition, plating, conductive paste coating, and the like for the conductive part.

Next, in step (2) according to the present invention, a heat dissipation unit is provided in at least some of the pores of the manufactured conductive fiber web.

The heat dissipation unit may be provided in the pores provided in the conductive fiber web by appropriately modifying a well-known method of filling pores of a porous substrate. As an example, a well-known coating method such as application, immersion, screen printing, float printing, or comma coating of a heat dissipation solution containing heat dissipation parts may be employed. Since the listed methods can be carried out by adopting conditions corresponding to the methods, a detailed description thereof will be omitted herein.

A conductive adhesive layer 200 may be additionally provided on at least one surface of the conductive fiber web 100 formed to include the above-described conductive composite fibers 10, 20, 30, 30', and 40, as shown in FIG. 1.

The conductive adhesive layer 200 may be a well-known conductive adhesive layer. As an example, the conductive adhesive layer 200 may be obtained by dispersing conductive fillers 220 in an adhesive matrix 210. For example, the adhesive matrix may be formed of one or more types of resins selected from an acrylic resin and an urethane resin, and the conductive fillers may be one or more types selected from the group consisting of nickel, nickel-graphite, carbon black, graphite, alumina, copper, and silver. The conductive adhesive layer 200 may include 5 to 95 wt % of the conductive fillers 220 with respect to the total weight of the conductive adhesive layer 200.

Also, the conductive adhesive layer 200 may have a thickness of 10 µm to 30 µm. When the thickness of the conductive adhesive layer 200 is excessive, electromagnetic wave shielding performance may not be exhibited at a desired level because the vertical resistance of the electromagnetic wave shielding material 1000 may be increased.

The conductive adhesive layer 200 may be formed by treating and impregnating a conductive adhesive layer forming composition on one surface of the conductive fiber web 100 to be formed. Thus, a portion of the conductive adhesive layer 200 may be formed on the conductive fiber web 100, and the remaining portion may be located inside the conductive fiber web 100 by filling the pores of the conductive fiber web 100.

An electromagnetic wave shielding material having the above-described conductive fiber web 100 may be implemented in an electromagnetic wave shielding-type circuit module 2000 as shown in FIG. 6. In detail, an electromagnetic wave shielding material 1100 may be provided on an upper portion of a circuit board 1200 where elements 1310 and 1320 are mounted to cover an upper portion and a lateral portion of the elements 1310 and 1320.

The circuit board 1200 may be a well-known circuit board provided in an electronic device. As an example, the circuit board 1200 may be a printed circuit board (PCB), a flexible printed circuit board (FPCB), or the like. The size and thickness of the circuit board 1200 may be changed depending on an internal design of an electronic device to be implemented. Therefore, the present invention has no particular limitation thereon.

Also, the elements 1310 and 1320 may be well-known elements mounted on a circuit board in an electronic device such as a driving chip and may be elements that easily malfunction since the elements generate electromagnetic waves and/or heat or are sensitive to electromagnetic waves.

The electromagnetic wave shielding material 1100 according to an embodiment of the present invention may be attached in close contact with the lateral portion of the elements 1310 and 1320 even when a separation distance between the adjacent elements 1310 and 1320 is small or even when there is a stepped portion due to the thicknesses of the elements 1310 and 1320. Therefore, the electromagnetic wave shielding material 1100 is advantageous in exhibiting enhanced electromagnetic wave shielding performance.

MODE OF THE INVENTION

The present invention will be described in detail with reference to the following embodiments. However, the following embodiments should not be construed as limiting the scope of the present invention, but should be construed as facilitating an understanding of the present invention.

<Embodiment 1>

A spinning solution was manufactured by dissolving 12 g of polyvinylidene fluoride in 85 g of dimethylacetamide and acetone, which are mixed at a weight ratio of 70:30, using a magnetic bar at a temperature of 80° C. for 6 hours. The spinning solution was poured into a solution tank of an electrospinning apparatus and then discharged at a rate of 20 µL/min/hole. In this case, a PVDF fiber web with an average diameter of 400 nm was manufactured by maintaining the temperature and humidity of the spinning section at 30° C. and 50%, setting a distance between a collector and a spinning nozzle tip to 20 cm, applying a voltage of 40 kV to a spin nozzle pack using a high voltage generator on the collector, and also applying an air pressure of 0.03 MPa per spin pack nozzle. Next, a calendering process was carried out on the fiber web by applying heat and pressure at 140° C. and 1 kgf/cm$^2$ in order to dry the remaining solvent and moisture.

Next, a metal shell part, which was made of nickel, was formed in the manufactured fiber web. In detail, nickel electroless plating was carried out on the fiber web. To this end, the fiber web was immersed in a degreasing solution at 60° C. for 30 seconds, then cleaned with pure water, further immersed in an etching solution (5M NaOH, pure water) at 60° C. for 1 minute, and then cleaned with pure water. Subsequently, the fiber web was immersed in a catalyst solution (Pd 0.9%, HCl 20%, pure water) at room temperature for 3 minutes and then cleaned with pure water. Subsequently, the fiber web was immersed in a sulfuric acid solution (H$_2$SO$_4$ 85 ml/L, pure water) for catalytic activity at 50° C. for 30 seconds, cleaned with pure water, immersed in a nickel ion solution at 60° C. for 1 minute 30 seconds, and then cleaned with pure water. The fiber part of the fiber web was covered with a metal shell part made of nickel with a thickness of 0.2 µm. As a result, a conductive fiber web having a thickness of 20 µm, a basis weight of 10 g/m$^2$, a porosity of 50%, and an average pore diameter of 0.7 µm was manufactured.

Subsequently, a process forming a heat dissipation unit was performed on the manufactured conductive fiber web. In detail, a heat dissipation unit forming composition was manufactured by mixing 8 parts by weight of alumina heat dissipation fillers having an average particle diameter of 1.6 µm with 100 parts by weigh of a composition containing an acrylic adhesive component using a mixing mixer. A release PET film was coated with the manufactured composition using a bar coater, laminated with the manufactured conductive fiber web on the coated surface, coated with a mixture solution, and laminated with a release PET film. Then, a calendering process was carried out. An electromagnetic wave shielding material as shown in Table 1 below was manufactured by performing a heat curing process on the laminated conductive shielding material in order to cure the heat dissipation unit at 120° C. for 24 hours.

<Embodiment 2>

A spinning solution was manufactured by dissolving 12 g of polyvinylidene fluoride in 88 g of dimethylacetamide and acetone, which are mixed at a weight ratio of 70:30, using a magnetic bar at a temperature of 80° C. for 6 hours. Spherical silver particles having an average particle diameter of 1.3 µm were mixed with the spinning solution as conductive fillers such that the polyvinylidene fluoride and the sliver particles had a volume ratio of 1:0.2 and the sliver particles occupied 16.7% of the total volume of the final fiber part, and then were dispersed using an ultrasonic disperser for 12 hours. The spinning solution was poured into a solution tank of an electrospinning apparatus, stirred through an impeller, and then discharged at a rate of 20 µL/min/hole. In this case, a fiber web formed of an Ag/PVDF composite fiber in which a second part with no silver particles had an average diameter of 300 nm was manufactured by maintaining the temperature and humidity of the spinning section at 30° C. and 50%, setting a distance between a collector and a spinning nozzle tip to 20 cm, applying a voltage of 40 kV to a spin nozzle pack using a high voltage generator, and also applying an air pressure of 0.05 MPa per spin pack nozzle. Next, a calendering process was carried out on the fiber web by applying heat and pressure at 140° C. and 1 kgf/cm$^2$ in order to dry the remaining solvent and moisture.

Next, a metal shell part, which was made of nickel, was formed in the manufactured fiber web. In detail, nickel electroless plating was carried out on the fiber web. To this end, the fiber web was immersed in a degreasing solution at 60° C. for 30 seconds, then cleaned with pure water, further immersed in an etching solution (5M NaOH, pure water) at 60° C. for 1 minute, and then cleaned with pure water. Subsequently, the fiber web was immersed in a catalyst solution (Pd 0.9%, HCl 20%, pure water) at room temperature for 3 minutes and then cleaned with pure water. Subsequently, the fiber web was immersed in a sulfuric acid solution (H$_2$SO$_4$ 85 ml/L, pure water) for catalytic activity at 50° C. for 30 seconds, cleaned with pure water, immersed in a nickel ion solution at 60° C. for 1 minute, and then cleaned with pure water. Thus, the fiber part of the fiber web was covered with a metal shell part made of nickel with a thickness of 0.12 µm. As a result, a conductive fiber web having a thickness of 10 µm, a basis weight of 12 g/m$^2$, and a porosity of 40% was manufactured. Subsequently, the electromagnetic wave shielding material as shown in Table 1 below was manufactured by forming a heat dissipation unit on the manufactured conductive fiber web like Embodiment 1.

<Embodiments 3 to 12>

A conductive fiber web as shown in Table 1 or Table 2 below was manufactured in the same way as in Embodiment 2, except that the content and particle diameter of the conductive fillers were changed as shown in Table 1 or Table 2 below.

<Embodiment 13>

A spinning solution was manufactured by dissolving 12 g of polyvinylidene fluoride in 88 g of dimethylacetamide and acetone, which are mixed at a weight ratio of 70:30, using a magnetic bar at a temperature of 80° C. for 6 hours. The spinning solution was poured into a solution tank of an electrospinning apparatus and then discharged at a rate of 20 µL/min/hole. In this case, a PVDF fiber web with an average diameter of 200 nm was manufactured by maintaining the temperature and humidity of the spinning section at 30° C. and 50%, setting a distance between a collector and a spinning nozzle tip to 20 cm, applying a voltage of 40 kV to a spin nozzle pack using a high voltage generator on the collector, and also applying an air pressure of 0.01 MPa per spin pack nozzle. Next, a calendering process was carried out on the fiber web by applying heat and pressure at 140° C. and 1 kgf/cm$^2$ in order to dry the remaining solvent and moisture.

Subsequently, a first conductive part, which is made of nickel, was formed in the manufactured fiber web. In detail, nickel electroless plating was carried out on the fiber web. To this end, the fiber web was immersed in a degreasing solution at 60° C. for 30 seconds, then cleaned with pure water, further immersed in an etching solution (5M NaOH, pure water) at 60° C. for 1 minute, and then cleaned with pure water. Subsequently, the fiber web was immersed in a catalyst solution (Pd 0.9%, HCl 20%, pure water) at room temperature for 3 minutes and then cleaned with pure water. Subsequently, the fiber web was immersed in a sulfuric acid solution (H$_2$SO$_4$ 85 ml/L, pure water) for catalytic activity at 50° C. for 30 seconds, cleaned with pure water, immersed in a nickel ion solution at 60° C. for 1 minute, and then cleaned with pure water. Thus, the fiber part of the fiber web was covered with the first conductive part made of nickel with a thickness of 0.12 µm.

Subsequently, by elongating the fiber web in which the first conductive part made of nickel was formed on the fiber part by a factor of 1.2 in one direction by means of a jig, a crack was generated in the first conductive part, and the fiber web was fixed to a frame while being elongated. Subsequently, in order to form a second conductive part, a second conductive part forming solution was manufactured. In detail, in order to improve the volatility of a dispersion solution obtained by mixing 1 to 1.5 parts by weight of PEDOT with 100 parts by weight of ultrapure water, 50 parts by weight of IPA was mixed with 100 parts by weight of the dispersion solution, and the mixture was stirred at room temperature for 6 hours. The fiber web fixed to the frame was spray-coated with the manufactured second conductive part forming solution, and then was dried in a vacuum oven at 60° C. Thus, the fiber web was covered with the second conductive part having a thickness of 0.06 µm. As a result, a conductive fiber web having a thickness of 20 µm, a basis weight of 11.5 g/m$^2$, and a porosity of 30% was manufactured as shown in Table 2 below. Through a scanning electron microscope (SEM) photograph captured on the manufactured conductive fiber web, it can be seen that the second conductive part filled a gap of the crack generated in the first conductive part.

<Comparative Example 1>

An electromagnetic wave shielding material was manufactured in the same way as in Embodiment 1, except that no heat dissipation unit was formed and the conductive fiber web itself was used as the electromagnetic wave shielding material.

<Experimental Example 1>

The following physical properties of the conductive fiber webs according to Embodiments 1 to 13 and Comparative Example 1 were measured and shown in Table 1 and Table 2 below.

1. Initial Electromagnetic Wave Shielding Performance

The surface resistance of the conductive fiber web was measured through a resistance meter (HIOKI 3540 mΩ HITESTER, HIOKI). The measured resistance value according to the embodiment was expressed by a relative percentage with respect to the measured value of Comparative Example 1 being set to 100.

2. Electromagnetic Wave Shielding Performance Variation

A specimen was elongated by a factor of 1.2 in the transverse direction and then by a factor of 1.2 in the longitudinal direction by means of a jig. This process was repeated three times.

Subsequently, a resistance value B for each specimen after elongation was found using the method of measuring the initial electromagnetic wave shielding performance, and a variation of each specimen according to elongation with respect to an initial resistance value A of each specimen was calculated using Equation 1.

In this case, the variation being increased means that the electromagnetic wave shielding performance is deteriorated.

$$\text{Variation (\%)}=(B-A)\times 100 \div A \quad \text{[Equation 11]}$$

3. Shape Retention

After the process was performed three times during the electromagnetic wave shielding performance variation measuring process, whether damage such as tearing had occurred was evaluated by checking the surface of the specimen by the naked eye. The case in which the damage had occurred was evaluated as ○, and the case in which the damage had not occurred was evaluated as x.

TABLE 1

| | | Embodiment 1 | Embodiment 2 | Embodiment 3 | Embodiment 4 | Embodiment 5 | Embodiment 6 | Embodiment 7 |
|---|---|---|---|---|---|---|---|---|
| Conductive Fillers | Particle Diameter (μm) | N/A | 1.3 | 1.45 | 1.6 | 0.25 | 0.35 | 0.75 |
| | Content (Volume %) | | 16.7 | 16.7 | 16.7 | 16.7 | 16.7 | 16.7 |
| Diameter of Second Part (nm) | | 400 | 300 | 300 | 300 | 300 | 300 | 300 |
| Diameter of Second Part:Diameter of Conductive Fillers | | — | 1:4.33 | 1:4.83 | 1:5.33 | 1:0.83 | 1:1.17 | 1:2.5 |
| Inclusion of Heat Dissipation Unit | | Yes | Yes | Yes | Yes | Yes | Yes | Yes |
| Initial Electromagnetic Wave Shielding Performance (%) | | 110.6 | 90.5 | 88.6 | 87.6 | 100.1 | 95.1 | 93.3 |
| Electromagnetic Wave Shielding Performance Variation (%) | | 28.9 | 11.7 | 12.2 | 25.8 | 26.6 | 18.5 | 14.4 |
| Shape Retention | | X | X | X | ○ | X | X | X |

TABLE 2

| | | Embodiment 8 | Embodiment 9 | Embodiment 10 | Embodiment 11 | Embodiment 12 | Embodiment 13 | Comparative Example 1 |
|---|---|---|---|---|---|---|---|---|
| Conductive Fillers | Particle Diameter (μm) | 1 | 1.3 | 1.3 | 1.3 | 1.3 | N/A | N/A |
| | Content (Volume %) | 16.7 | 8.5 | 10.5 | 49 | 52 | | |
| Diameter of Second Part (nm) | | 300 | 300 | 300 | 300 | 300 | 200 | 400 |
| Diameter of Second Part:Diameter of Conductive Fillers | | 1:3.33 | 1:4.33 | 1:4.33 | 1:4.33 | 1:4.33 | — | — |
| Inclusion of Heat Dissipation Unit | | Yes | Yes | Yes | Yes | Yes | Yes | No |
| Initial Electromagnetic Wave Shielding Performance (%) | | 91.4 | 99.6 | 94.3 | 80.2 | 79.6 | 103.0 | 100 |
| Electromagnetic Wave Shielding Performance Variation (%) | | 12.0 | 15.4 | 11.6 | 16.6 | 25.9 | 13.6 | 39.6 |
| Shape Retention | | X | X | X | X | ○ | X | X |

As can be seen from Table 1 and Table 2, the electromagnetic wave shielding performance variation was significantly higher in Comparative Example 1, in which no heat dissipation unit was provided, than in Embodiment 1.

Meanwhile, it can be seen that tearing caused by elongation occurred due to the lowering of the mechanical strength and thus the variation was also high in Embodiment 4, in which the particle diameter of the conductive fillers was out of the preferable range of the present invention, or in Embodiment 12, in which the content was out of the preferable range of the present invention, among Embodiments 2 to 12.

specimen was subjected to the elongation/contraction process. Also, the case in which damage such as tearing had occurred after the elongation/contraction process and the recovery process were repeated three times was marked with ○ and the case in which the damage had not occurred was marked with x. In this case, the area variation was not calculated on the specimen with damage such as tearing.

$$\text{Area Variation (\%)} = (C-D) \times 100 \div D \qquad [\text{Equation 2}]$$

Also, the area variation being increased means that a recovery force is not good after elongation.

TABLE 3

| | | Embodiment 1 | Embodiment 14 | Embodiment 15 | Embodiment 16 | Embodiment 17 | Embodiment 18 | Embodiment 19 | Embodiment 20 |
|---|---|---|---|---|---|---|---|---|---|
| Fiber Forming Component | Weight Ratio of PVDF:polyurethane | 1:0.0 | 1:0.43 | 1:1.45 | 1:1.6 | 1:1.9 | 1:2.2 | 1:0.14 | 1:0.22 |
| Electromagnetic Wave Shielding Performance Variation (%) | | 29.6 | 6.3 | 8.2 | 11.3 | 12.7 | 23.6 | 25.9 | 10.1 |
| Shape Retention | Presence of Damage | ○ | X | X | X | X | ○ | ○ | X |
| | Area Variation (%) | N/A | 3.0 | 6.2 | 6.6 | 7.5 | N/A | N/A | 2.0 |

<Embodiment 14>

An electromagnetic wave shielding material was manufactured in the same way as in Embodiment 1, except that the fiber forming component and the solvent of the spinning solution were changed. In detail, a spinning solution was manufactured by dissolving 16 g of a fiber forming component obtained by mixing polyvinylidene fluoride and polyurethane at a weight ratio of 7:3 in 84 g of a solvent obtained by mixing dimethylacetamide and acetone at a weight ratio of 7:3 using a magnetic bar at a temperature of 60° C. for 6 hours. Thus, a conductive fiber web having a thickness of 20 μm, a basis weight of 9.8 g/m², a porosity of 50%, and an average pore diameter of 0.7 μm was manufactured, and then the electromagnetic wave shielding material as shown in Table 3 below was manufactured by subsequently forming a heat dissipation unit.

<Embodiments 15 to 20>

A conductive fiber web as shown in Table 3 below was manufactured in the same way as in Embodiment 14, except the content ratio between the PVDF and the polyurethane, which were contained in the fiber forming component, was changed as shown in Table 3 below.

<Experimental Example 2>

The following physical properties were evaluated on Embodiments 1 and 14 to 20 and shown in Table 3 below.

1. Electromagnetic Wave Shielding Performance Variation

A specimen was elongated by a factor of 1.4 in the transverse direction and then by a factor of 1.4 in the longitudinal direction by means of a jig while a stress was removed. This process was repeated three times.

Subsequently, the variation was calculated using Equation 1 in the same way as the evaluation method in Experimental Example 1. In this case, the variation being increased means that the electromagnetic wave shielding performance is deteriorated.

2. Shape Retention

In order to evaluate the retention of the electromagnetic wave shielding performance, an area C of a specimen was calculated after the transverse and longitudinal elongation/contraction processes and recovery process were repeated three times. An area variation was calculated using Equation 2 with respect to an initial area D of the specimen before the As can be seen from Table 3, as an elongation rate further increased in Embodiment 1, in which polyurethane was not included as the fiber forming component of the fiber part, than in Experimental Example 1, tearing occurred and also the electromagnetic wave shielding performance variation increased significantly.

Also, it can be seen that tearing occurred in Embodiment 19, in which the polyurethane is contained but too little, or in Embodiment 18, in which the polyurethane is excessively contained, and thus the electromagnetic wave shielding performance variation increased significantly.

Meanwhile, the tearing having occurred in Embodiment 18 despite an increase in amount of the polyurethane might be expected to be due to a result caused by the damage to the fiber part according to various solutions applied during a plating process.

<Manufacturing Example>

In order to manufacture a conductive adhesive layer, a mixture solution was manufactured by mixing 7 parts by weight of nickel particles having an average particle diameter of 3 μm with 100 parts by weight of a conductive adhesive composition containing an acrylic adhesive forming component by means of a mixing mixer. A release PET film was coated with the manufactured mixture solution using a bar coater, laminated with the conductive fiber web manufactured according to Embodiment 1 on the coated surface, coated with the mixture solution again, and laminated with a release PET film. Then, a calendering process was carried out. In order to cure the acrylic adhesive layer, a heat curing process was performed on the laminated conductive shielding material at 120° C. for 24 hours. Thus, an electromagnetic wave shielding material where a conductive adhesive layer was formed on both surfaces of the conductive fiber web was manufactured.

While embodiments of the present invention have been described above, the scope of the present invention is not limited to the disclosed embodiments. Those skilled in the art of the present invention can readily suggest another embodiment by adding, modifying, or deleting components without departing from the scope of the present invention, but the suggested embodiment is construed as being within the scope of the present invention.

The invention claimed is:

1. A flexible electromagnetic wave shielding material comprising:
   a conductive fiber web including multiple pores, wherein the conductive fiber web comprises a conductive composite fiber comprising a fiber part and a conductive part covering an outside of the fiber part; and
   a heat dissipation unit provided to fill at least some of the pores and comprising at least one of a phase-change material and a thermally conductive filler,
   wherein the fiber part comprises polyvinylidene fluoride (PVDF) and polyurethane at a weight ratio of 1:0.2 to 1:2.0 as a fiber forming component.

2. The flexible electromagnetic wave shielding material of claim 1, wherein the fiber part further includes conductive filler.

3. The flexible electromagnetic wave shielding material of claim 1, wherein
   the conductive part includes a first conductive part and a second conductive part sequentially covering the outside of the fiber part, and
   the second conductive part infiltrates into a crack formed in the first conductive part.

4. The flexible electromagnetic wave shielding material of claim 1, wherein the conductive composite fiber has a diameter of 0.2 μm to 10 μm.

5. The flexible electromagnetic wave shielding material of claim 1, wherein the conductive fiber web has a thickness of 5 μm to 200 μm and a basis weight of 5 g/m$^2$ to 100 g/m$^2$.

6. The flexible electromagnetic wave shielding material of claim 1, wherein
   the thermally conductive filler includes one or more heat dissipation fillers among one or more conductive heat dissipation fillers selected from the group consisting of a carbon nanotube graphene, graphene oxide, graphite, carbon black, nickel, silver, copper, iron, gold, aluminum, titanium alloys, platinum, chromium, and a carbon-metal complex; and one or more insulating heat dissipation fillers selected from the group consisting of silicon carbide, magnesium oxide, titanium dioxide, aluminum nitride, silicon nitride, boron nitride, aluminum oxide, silica, zinc oxide, barium titanate, strontium titanate, beryllium oxide, manganese oxide, zirconia oxide, and boron oxide.

7. The flexible electromagnetic wave shielding material of claim 1, wherein the conductive part contains one or more of one or more types of metals selected from the group consisting of aluminum, nickel, copper, silver, gold, chromium, platinum, titanium alloys, and stainless steel; and conductive polymer compounds.

8. The flexible electromagnetic wave shielding material of claim 1, wherein the conductive part has a thickness of 0.1 μm to 2 μm.

9. The flexible electromagnetic wave shielding material of claim 1, wherein the conductive fiber web has a porosity of 30% to 80%.

10. The flexible electromagnetic wave shielding material of claim 1, wherein a conductive adhesive layer is further provided on at least one surface of the conductive fiber web.

11. The flexible electromagnetic wave shielding material of claim 1, wherein
    the heat dissipation unit is located inside the conductive fiber web, and
    the heat dissipation unit is not placed on all or a portion of an outer surface of the conductive fiber web.

12. An electromagnetic wave shielding-type circuit module comprising:
    a circuit board with an element mounted thereon; and
    the electromagnetic wave shielding material according to claim 1, the electromagnetic wave shielding material provided on the circuit board to cover at least an upper portion and a side portion of the element.

13. An electronic device comprising the electromagnetic wave shielding-type circuit module according to claim 12.

14. The flexible electromagnetic wave shielding material of claim 1, wherein the carbon nanotube is a single-wall carbon nanotube, a double-wall carbon nanotube, or a multi-wall carbon nanotube.

* * * * *